(12) United States Patent
Hua et al.

(10) Patent No.: US 10,014,050 B2
(45) Date of Patent: *Jul. 3, 2018

(54) HIGH SUM-RATE WRITE-ONCE MEMORY

(71) Applicant: Queen's University at Kingston, Kingston (CA)

(72) Inventors: Jay Hua, Brockville (CA); Shahram Yousefi, Kingston (CA)

(73) Assignee: Queen's University at Kingston, Kingston (CA)

( * ) Notice: Subject to any disclaimer, the term of this patent is extended or adjusted under 35 U.S.C. 154(b) by 0 days.

This patent is subject to a terminal disclaimer.

(21) Appl. No.: 15/444,733

(22) Filed: Feb. 28, 2017

(65) Prior Publication Data

US 2017/0323679 A1 Nov. 9, 2017

Related U.S. Application Data

(63) Continuation of application No. 14/997,688, filed on Jan. 18, 2016, now Pat. No. 9,607,690.

(60) Provisional application No. 62/104,911, filed on Jan. 19, 2015.

(51) Int. Cl.
| | |
|---|---|
| *G11C 16/26* | (2006.01) |
| *G11C 16/10* | (2006.01) |
| *G11C 16/04* | (2006.01) |
| *G11C 16/08* | (2006.01) |
| *G11C 11/56* | (2006.01) |
| *G11C 7/10* | (2006.01) |
| *G11C 16/34* | (2006.01) |

(52) U.S. Cl.
CPC ........ *G11C 11/5628* (2013.01); *G11C 7/1006* (2013.01); *G11C 16/08* (2013.01); *G11C 16/3495* (2013.01); *G11C 16/0483* (2013.01); *G11C 16/10* (2013.01); *G11C 16/26* (2013.01)

(58) Field of Classification Search
CPC ..... G11C 16/10; G11C 16/0483; G11C 16/26; G11C 16/08; G11C 11/5628
USPC ....................................... 365/185.03, 185.17
See application file for complete search history.

(56) References Cited

U.S. PATENT DOCUMENTS

| | | | |
|---|---|---|---|
| 4,884,264 | A | 11/1989 | Servel et al. |
| 6,687,901 | B1 | 2/2004 | Imamatsu |
| 6,701,408 | B2 | 3/2004 | Egner et al. |
| 7,529,142 | B2 | 5/2009 | Widdershoven |
| 8,848,412 | B1 | 9/2014 | Yeung et al. |
| 2010/0313065 | A1 | 12/2010 | Feeley et al. |

(Continued)

OTHER PUBLICATIONS

Kumar, S., et al., "Solid State Drive (SSD) FAQ", Dell, pp. 1-12, (2011).

(Continued)

*Primary Examiner* — Ly D Pham
(74) *Attorney, Agent, or Firm* — Stephen J. Scribner

(57) ABSTRACT

Provided are modified one-hot (MOH) constructions for WOM codes with low encoding and decoding complexity, that achieve high sum-rates. Features include maximizing writing of data information values for successive rewrites, all-zero and all-one cell state vectors that represent a unique data information value that can be written for many generations, a very high number of writes, and does not sacrifice capacity. One embodiment comprises ordered or unordered MOH code that approaches the upper-bound for large n wits. According to the embodiments, before an erasure is needed, the majority of the wits are encoded, which provides level wearing and maximizes life of cells.

20 Claims, 5 Drawing Sheets

(56) References Cited

U.S. PATENT DOCUMENTS

| | | |
|---|---|---|
| 2012/0079174 A1 | 3/2012 | Nellans et al. |
| 2012/0096234 A1 | 4/2012 | Jiang et al. |
| 2013/0080681 A1 | 3/2013 | Yaakobi et al. |
| 2013/0091402 A1 | 4/2013 | Yaakobi et al. |
| 2013/0254466 A1 | 9/2013 | Jiang et al. |
| 2014/0244912 A1 | 8/2014 | Birk et al. |
| 2015/0248325 A1 | 9/2015 | Calderbank et al. |
| 2016/0087820 A1 | 3/2016 | Sahin et al. |

OTHER PUBLICATIONS

Li, Y., "Overcoming the Challenges of 10nm-class NAND Flash Memory", Flash Memory Summit, Santa Clara California, pp. 1-23. (2013).

United States Office Action dated May 9, 2016 for parent U.S. Appl. No. 14/997,688.

HIGH SUM-RATE WRITE-ONCE MEMORY

RELATED APPLICATION

This application is a continuation of application Ser. No. 14/997,688, filed on Jan. 18, 2016, now U.S. Pat. No. 9,607,690, and claims the benefit of the filing date of U.S. Application No. 62/104,911, filed on Jan. 19, 2015, the contents of which are incorporated herein by reference in their entirety.

FIELD

This invention relates to methods and constructions for operating a digital memory.

BACKGROUND

Flash memories are used everywhere to store files, media, and programs due to their portability. Solid state disks (designed with flash memories) are replacing traditional hard disk drives due to their superior data read time and transfer rates. Programming a memory cell (hereinafter referred to as a "cell") is done by electron injection (i.e., hot electron injection creates an electric field) to increase the voltage incrementally above a charge threshold. Conversely, erasing is done by removing electrons to decrease the charge level to zero. The main disadvantage is the limited number of erases (10,000 to 100,000) during the flash lifecycle. The write and subsequent re-write processes require a suitable block of cells ($10^6$) that allows electron injection to increase the desired cells from a lower voltage level to a higher voltage level. If there are not enough suitable cells then an erasure (cell voltages are dropped to the lowest level) is needed. Within a block, any single cell's voltage level can be increased as needed (i.e., programmed), however all cells within the block must have their voltage charges lowered if an erasure is needed. As a result, data may be erased needlessly, because deleting a single cell is impossible without changing the physical medium completely. Since the main constraint of encoding involves only increasing a cell's levels (i.e., cannot decrease), previous work has shown that using permutations of cells can allow data values to be rewritten.

Basic single cell level (SCL) flash memory uses two cell levels, each respectively representing either the on state or off state. Currently, multiple level cells (MLC) with four cell levels and triple level cell (TLC) with eight cell levels are also used. Current research is focused on three issues: error correction, interference, and increasing cell sum-rate. Increasing cell sum-rate is of particular interest; however, truly high cell sum-rates have not been achieved, and current state of the art codes use a high number of cells to achieve a particular sum-rate in relation to a specified number of writes.

SUMMARY

Provided herein are methods and constructions for operating a digital memory. Relative to prior methods, the embodiments vastly improve trade-offs between the number of rewrites before erasures and the amount of encoded data in all the generations.

Embodiments include methods and constructions for WOM and WAM codes with low encoding and decoding complexity while achieving the highest sum-rates possible after approximately 1000 writes. In the binary embodiments, the constructions achieve the highest sum-rates for $t \geq 7$ and approach the capacity as n and t are increased.

Binary, ternary, and quaternary MOH code embodiments are all within constants 1.44, 3.89 and 6.49 bits in their sum-rates from the capacity in the very worst cases. Since for MOH codes according to embodiments described herein, t and n are essentially equal, only 1000 cells are needed to achieve a sum-rate 1.44 bits away from the capacity. This makes cell block sizes (n) much smaller when compared to the current state of the art WOM codes. Thus, embodiments are very practical to implement since a typical block size in a flash memory is $10^6$. The embodiments also allow very high number of writes and do not sacrifice capacity. Before an erasure is needed, the majority of the writable cells are encoded, such that even wearing of cells is achieved, thereby extending the life of the cells.

Decoder embodiments do not need to store the number of writes in extra storage units and can be easily used for any q-ary digital memory system. Encoder and decoder embodiments have a practical running time complexity that is polynomial in n.

Embodiments include one or more of the following features:

1) Achieve very high sum-rate;
2) Before each erasure, at least (n−1) out of n cells are encoded, such that over time, substantially all cells are subjected to the same number of writes, and will reach failure after the same number of writes;
3) Polynomial in n complexity decoding and encoding, wherein no extra wits are needed to store a generation number;
4) The encoding is not complex in that each value encodes the same cell to reach another value without dependence on a current generation;
5) Allow (n−1) writes;
6) From 1 and 5, the traditional trade-offs between high sum-rate and high writes are vastly reduced.

According to one aspect, there is provided a method for operating a digital memory, comprising: minimizing a number of memory cells encoded for a write operation; and avoiding erasing memory cells by re-using written memory cells; wherein a sum-rate of the digital memory is maximized.

In certain embodiments, minimizing the number of memory cells or maximizing the sum rate may require writing more than one cell at some generations.

In another embodiment, minimizing the number of memory cells comprises encoding one cell for each write operation.

In one embodiment, minimizing the number of memory cells comprises constructing cell state vectors that are uniquely decodable.

One embodiment further comprises decoding each permutation of memory cells into a unique value.

One embodiment comprises encoding cells synchronously, wherein a cell state vector is related to a selected generation.

In one embodiment, the digital memory is a write-once memory (WOM), or a write-asymmetric memory (WAM).

According to another aspect there is provided programmed media for use with a processor, comprising: a code stored on non-transitory storage media compatible with the processor, the code containing instructions to direct the processor to operate a digital memory by: minimizing a number of memory cells encoded for a write operation; and avoiding erasing memory cells by re-using written memory cells; wherein the code maximizes a sum-rate of the digital memory.

According to another aspect there is provided a digital memory device comprising the programmed media and digital memory.

BRIEF DESCRIPTION OF THE DRAWINGS

For a greater understanding of the invention, and to show more clearly how it may be carried into effect, embodiments will be described, by way of example, with reference to the accompanying drawings, wherein.

DETAILED DESCRIPTION OF EMBODIMENTS

Figure 1A:
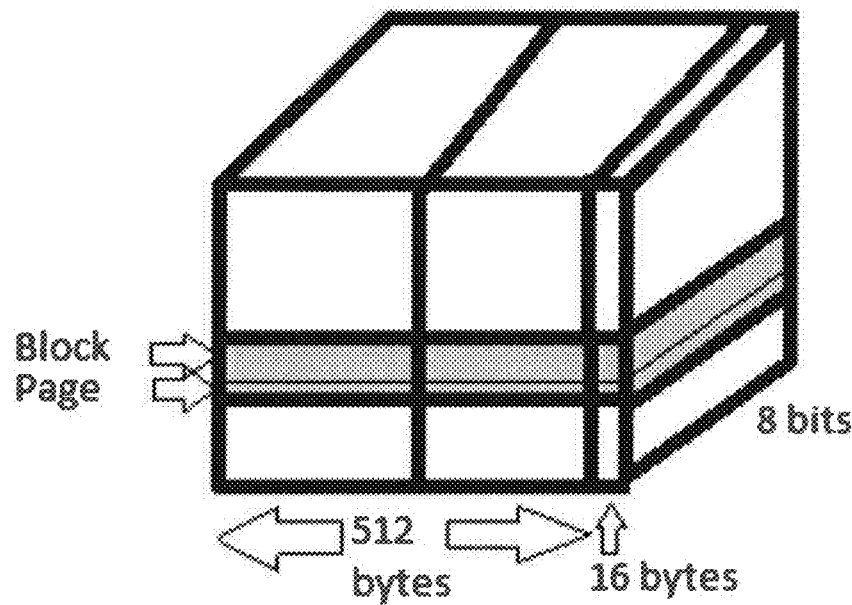
FIG. 1(a) is a diagram representing a flash memory module partitioned into blocks and pages, according to the prior art.

According to a broad aspect of the invention, there are provided digital memory devices, and methods and programmed media for operating a digital memory. The term "operating" is intended to include writing data to and/or reading data from a digital memory.

Embodiments described herein include write-once memory (WOM) codes implemented in memory hardware that include one or features that address deficiencies of previous write-once memory. The one or more features may include one or more of providing very high sum-rates, maximizing the number of writes before erasures, balancing wear of the cells to ensure proper data retention and to increase the longevity of flash memory, storing as much information as possible before an erasure is needed. The embodiments may be applied to, for example, flash memory with any q cell levels. For example, one embodiment provides WOM codes that achieve higher sum-rates than currently known, while simultaneously achieving high rewrites.

Embodiments may be constructed in any suitable code that can be executed by a processor associated with the memory, for controlling operation of the memory. Thus, embodiments may be implemented in any device that uses memory. The executable programmed instructions for directing the processor to implement embodiments of the invention may be implemented in one or more hardware modules and/or software modules resident in the processing system or elsewhere. In one embodiment the programmed instructions may be embodied on a non-transitory computer readable storage medium or product (e.g., a compact disk (CD), etc.) which may be used for transporting the programmed instructions to the memory of the data processing system and/or for executing the programmed instructions. In one embodiment the programmed instructions may be embedded in a computer-readable signal or signal-bearing medium (or product) that is uploaded to a network by a vendor or supplier of the programmed instructions, and this signal or signal-bearing medium may be downloaded through an interface to the data processing system from the network by end users or potential buyers.

The maximum achievable number of information bits stored per cell for any number of writes is referred to as the capacity. No practical coding scheme is currently known that achieves sum-rates that equal the capacity. Increasing the number of rewrites before an erasure is needed will prolong the lifespan of a flash memory device, since the number of erasures per transistor is limited. The primary challenge is to develop efficient coding that can re-use dirty (written) cells to increase the storage as many times as possible (i.e., increasing writes) before an erasure is needed. Currently-known codes use a large number of cells to achieve a particular sum-rate in relation to the specified number of writes. In contrast, the embodiments described herein achieve higher sum-rates for the same number of writes, and also use fewer cells. This means that for the same number n of cells used, the embodiments will multiply the sum-rates when compared to previously-known codes. In some embodiments, the maximum or upper bound sum-rate is approached. As described herein, embodiments are based on finite values rather than values derived asymptotically as n cells approach infinity.

For example, for a typical 16 Megabyte (MB) flash memory storage device without any coding, the entire device (n=128,000,000 cells), can allow storage of exactly 16 MB of information (per erasure) for just one write. However, in accordance with coding embodiments described herein, by increasing the sum-rate to, e.g., 1.5, the flash code would now allow 24 MB of information per erasure spread over multiple writes on the same device. Since a storage device would incur multiple operations to store segmented information (a typical storage device retains thousands of smaller files instead of one big file), the increase in sum-rate through such coding is thus highly desirable.

Previous work (R. L. Rivest and A. Shamir, *Inform. and Control*, 55:1-19, 1982) showed a construction for a two-write WOM code using three cells to represent two bits of data. There have been WOM constructions based on coset coding via linear block codes and lattice coding, and position modulation techniques. Some non-decodable WOM constructions require additional knowledge of current data generation (j-th write) to correctly decode, which can be obtained by using log(t−1) additional cells, where t is the number of rewrites. In contrast to that previous work, decodable code embodiments described herein do not require extra storage on the j-th write, which reduces any overhead.

Embodiments are described herein primarily with respect to WOM codes, where each cell state is either 0 or 1. However, write asymmetric memory (WAM) constructions may also be made in accordance with the approaches described herein. One aspect of the embodiments is based on an approach wherein only one cell is encoded for each write. By just using one cell, there is a reduction in the redundancy of representing valid data for many future rewrites. This approach is referred to herein as modified one-hot (MOH) code. As described herein, this approach achieves higher sum-rates than currently known WOM constructions. As one example, a complete construction for a 6 write binary code is described below. The achieved sum-rate is at least 2.102 compared to the previous best known sum-rate of 2.1331 (E. Yaakobi, et al., *IEEE Trans. Inform. Theory*, 58:5985-5999, 2012). For writes greater than 6, embodiments described herein achieve the highest sum-rates currently known. Further, embodiments described herein achieve the highest rates for t≥7 and approach the upper bound (i.e., capacity) as n increases to large values. In addition, as described herein, MOH code construction embodiments achieve the capacity once ~($10^6$) cells are used. Further features include balanced wear of the cells, no-cost decoding, and low complexity encoding. MOH code addresses the major deficiencies in achievable sum-rate, maximizing writes, and retention quality by balanced wearing.

For WOM codes, if there are n total cells and only one cell is used for each rewrite, the largest number of writes, t, is upper bounded by n. In general, the more rewrites supported results in lower instantaneous rates for each write. That is, to save more 0 state cells for future writes, there must be a limit on the number of bits previously written. As a typical example, a position modulation code for t=6 writes requires n=196 cells. Embodiments described herein provide improvements by targeting this large amount of overhead, wherein MOH code is optimal for both t writes and the achieved sum-rate as t≈n.

Comparison with Position Modulation

Prior work (Y. Wu and A. Jiang, *IEEE Trans. Inform. Theory*, 57:3692-3697, 2011) focussed on small rewrites and moderate data sizes, instead of asymptotic behaviour. The cardinality of an information set can be written depending on the number of k encoded cells. The lexical order of a sequence of cells is computed by choosing i spots out of k. This gives position modulation code polynomial encoding and decoding complexity. This construction had the highest sum-rates for 5 writes at 1.63, 6 writes at 1.71, 8 writes at 1.88, 9 writes at 1.95, and 10 writes at 2.01. For writes up to 50, the sum-rate of position modulation is limited to under 2.8. For comparison, the technique of Rivest and Shamir (1982) referred to above provides a sum-rate of less than 2 for writes up to 50. In contrast, in the MOH code embodiment in the example described herein, for 6 writes, only 7 cells are needed compared to 196 cells used by position modulation. If eight cells are used, a MOH code construction can allow a seven write code with a sum-rate of at least 2.3563.

Comparison with Coset Coding

Prior work (E. Yaakobi, et al., *IEEE Trans. Inform. Theory*, 58:5985-5999, 2012) provided a flash construction based on linear codes. Linear codes are extensively used for error detecting and correcting in communication systems. An (n, k) linear code utilizes n bits to represent k bits of information; there are (n−k) redundant bits or parities for error detection and correction. Consider a linear block code with (n−k)×n parity-check matrix H. $2^n$ information vectors are divided into $2^{n-k}$ disjoint cosets. Each coset has $2^k$ elements. For the first write, m of the n cells are flipped from state "0" to state "1". This n sequence of the states is referred to as the vector s after the first write. To write a (n−k)-bit message vector y for the second write given the initial state s, the encoder looks for a vector c≥s such that $cH^T=y$. The message for the second write is carried by the coset index (syndrome). The encoding and decoding scheme is also polynomial complexity. This work provided a 2-write WOM code using 33 cells to achieve a sum-rate of 1.49. In contrast, for 31 cells, embodiments described herein achieve a sum-rate of at least 3.77 (i.e., a 253% increase) while supporting 30 writes. This translates to extending the memory life by 15 times.

Modified One-Hot Code

The minimal number of cells to encode for each generation (i.e., each write iteration) is at least one cell. In these embodiments, the objective is to provide a code that uses only one cell at each write, and at the same time is able to represent as much as possible, or all, of the data to be stored. As described herein, this may be achieved by constructing cell vectors that will always be uniquely decodable. As described herein, this requires a unique decoder design that decodes any cell permutation into unique values. In addition, the embodiments include one or more features such as: encoding and decoding schemes that are generation-independent, such that the encoding and decoding schemes are always substantially the same regardless of the current number of writes or cell states; code that is synchronous, wherein a cell state vector can only be reached at a particular generation and is thus decodable without knowing the generation number; and a construction that can approach or achieve the upper bound using a finite number of cells. In one embodiment, for example, the construction uses just 7 cells for 6 writes, and achieves a sum-rate of at least 2.102. Not only does MOH code achieve higher rates for the same number of writes, but it also uses much smaller values of n. Using block code construction, Yaakobi, et al. (2012), discussed above, achieved a high rate for 2 writes using 33 cells, whereas using two fewer cells the rate achieved using a MOH code according to one embodiment is doubled and the number of rewrites supported increases by 15 times.

MOH codes as described herein address the major deficiencies of current write-once memory, use values of n that are practical and match typical block sizes used in industry. Encoders and decoders use common digital logic and circuitry. Thus, embodiments can be easily implemented without long development and production times. Embodiments may be constructed in any suitable code that can be executed by a processor associated with the memory, for controlling operation of the memory. The embodiments are compatible with existing flash memory hardware configurations, such as those available from manufacturers including, e.g., Intel, Micron, and Spansion. Accordingly, implementation of embodiments is straight-forward as no hardware re-design is required. However, it will be appreciated that embodiment described herein and variants thereof may also be implemented in custom hardware configurations and other digital memory technologies.

NAND Technology

MOH code embodiments as described herein are suitable for use in NAND technologies such as those manufactured by, e.g., Intel, Micron, and Spansion. NAND technologies usually can store higher densities (compared to NOR), and are used mainly for mass digital storage applications in camcorders, smartphones, tablets, flash drives, and solid state disks (SSD). Single level charge (SLC) cells contain two levels of voltage charge region, which allows one bit of data capacity (binary one-hot code) per cell. Multilevel charge (MLC) cells contain, for example, four levels of charge; this allows two bits of data capacity (quaternary one-hot code) per cell.

Figure 1B:
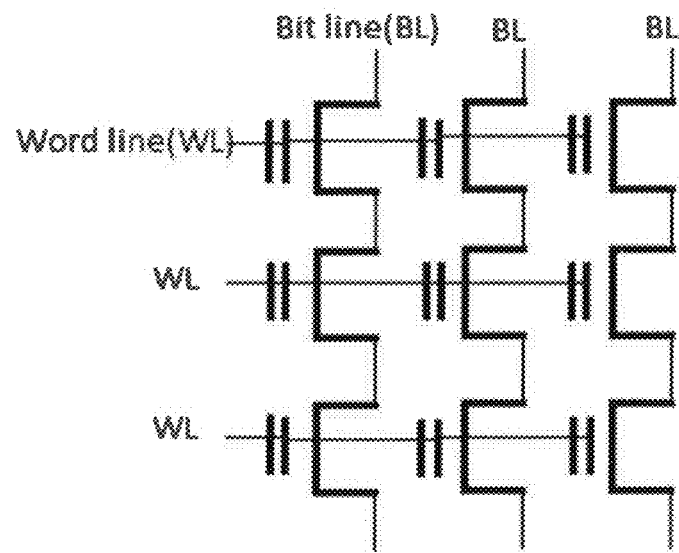
FIG. 1(b) is a schematic representation within a block of cells of a flash memory module, according to the prior art.

FIG. 1(*a*) shows a typical SLC 128 Megabit (Mbit) NAND memory cell organization, and FIG. 1(*b*) is a zoomed in view of a section of a block/page. The structure as shown in FIG. 1(*a*) illustrates a page of the smallest number of cells that can be read from memory. FIG. 1(*b*) shows that any single cell can be programmed as needed. However, the smallest number of cells that can be erased is a block as shown by the shaded region in FIG. 1(a). Based on devices from Micron, as one example, a 128 Mbit memory has 1004 to 1024 valid blocks, and 2008 to 2048 for a 256 Mbit version. For eight bit devices, there are 16 bytes (8 bits=1 byte) usually reserved for error correcting code (ECC) per page. For 16 bit devices, there are eight words reserved for ECC per page. A page for the eight bit device consists of 4096+128=4224 bits, or cells. This equates to a block of 131072+4096=135168 cells. A single cell can thus cause an erasure to 135167 other good cells during a block erasure. Larger densities of NAND (e.g., 1 Gbit) use blocks with 64 pages, 2048+64 bytes per page, for a total of 1024 blocks. This equates to a block of roughly 1081344 cells.

In accordance with embodiments described herein, sum-rates achieved using MOH code greatly outperforms current state of the art coding schemes for these parameters (e.g., cells up to $10^6$). For mass digital storage manufacturers like Intel®, SSDs can support densities up to 512 Gigabytes (GB) and 1 Terabyte (TB). Page sizes for these SSDs are typically 4 Kilobytes (KB) and 8 KB.

NOR Technology

NOR flash are produced in smaller densities in the range of 2 Mbit to 1 Gbit. The smaller densities are typically used in low digital storage requirements such as system caches. A 2 Mbit flash memory may have a block size of 64 KB, and 128 KB to 256 KB for larger densities. Unlike NAND, each cell can only store one bit of data, and each block is not partitioned into smaller pages. Physically, NOR cells are zeroed when the bit is high (one). MOH code embodiments as described herein may be suitable for use in NOR technologies, where, at least in some cases, additional simple logic may be implemented. For example, an inverter may be used when decoding and encoding, insofar as NOR may be considered as a logic complement of NAND.

Flash Model

Linear WOM codes are a broader family of one-hot codes. Rivest and Shamir (1982) showed that for a fixed size data set M, with cardinality |M|, a valid cell state or codeword will represent each element m∈M. These codes are linear in the sense that codewords (c1+c2) mod q is another codeword c3, where q is an integer value. The fixed sum-rate for a restricted M and q=2 is log(n)/4, and the number oft writes supported is t=|M|/4. To guarantee |M| for each successive write, the minimum number of t is M/4. That is, |M| is the same for any write.

However, as described herein, if |M| is unrestricted for successive writes, the achievable sum-rate is much higher. That is, for each j-th write, |Mi+1|=|Mi|−1. The decoder for a Linear WOM code is just the modulo-q sum of all the cells in the programmed state. A trajectory code is a Linear WOM code where q=|M| (A. Jiang, et al., *IEEE Trans. Inform. Theory*, 59:4530-4541, 2013), wherein for a fixed M, the decoder is a modulo-M sum of all the cells in the programmed state.

In contrast, in the embodiments described herein, M is not fixed, and such an example is described below and compared with the current state of the art. In addition, as described below, Linear WOM codes are expanded for WAM constructions by constructing an alternate decoder definition.

Notations used herein are as commonly used in WOM codes. The memory cell-state vector $\vec{c}=(c_1, c_2, \ldots, c_n) \in \{0, 1\}^n$ is a q-ary vector of length n. Each $\vec{c}$ is known as a codeword that is outputted from an encoder. For a binary cell, injecting a cell's gate with electrons past each threshold voltage $V_{TH}$ results in a cell state increase from "0" to "1", conversely removing electrons below $V_{TH}$ transitions the state down to "0".

Definitions are as follows:

Definition 1. A cell that can be programmed is a wit. A with is a q-ary digit in GF(q). For example, a SLC with is a binary digit.

A flash code uses n wits to store information. The encoding and decoding operations are those of the Galois Field of order q, GF(q). For example, in GF(2), multiplication (·) is a logical AND, and addition is a logical exclusive OR (XOR).

$M_j$ represents the set of data values to be written in the j-th write. The cardinality of a set is denoted by |•|.

Definition 2. A code is restricted if $|M_j|$ is the same for all j.

Definition 3. A code is generation-independent or synchronous if an encoded message (codeword or the content of the n cells) can only be written at a specific write/generation.

Definition 4. A non-synchronous code allows a codeword to represent different messages at different generations. It is un-decodable without using extra storage wits to keep track of the generation number.

Definition 5. A WOM code is a coding scheme used for a two-level cell (SLC) that has cell states of 0 and 1.

Definition 6. A WAM code is a coding scheme used for cell levels that are greater than two. For example, this is suitable for MLC and TLC flash memory.

Definition 7. For the sake of brevity, each addition or multiplication required for the encoding or decoding processes is counted as 1 floating point operation or FLOP.

Definition 8. O(•) is the Big-Oh expression for quantifying the asymptotic manning e taken by an algorithm to run as a function of the input size.

In one embodiment, let $\varepsilon_j: M_j \to GF(q)^n$ and $D_j: GF(q)^n \to M_j$ denote the encoding and decoding functions of the j-th write. Then the state of the cells for a message m is given by the q-ary vector $\varepsilon_1(m)=c$ with $D_1(\varepsilon_1(m))=m$ for the first write.

The instantaneous rate on the j-th write is defined to be $$R_j = \frac{\log_2 |M_j|}{n}, \quad (1)$$

Thus, the sum-rate equation for t writes is $$R_{sum} = \sum_{j=1}^{t} R_j. \quad (2)$$

Results are compared to the current highest rates as well as to the upper hound, that is, the capacity (C) as found by Fu and Han Vinck (IEEE *Trans. Inform. Theory*, 45: 308-313, 1999):

$$R_{sum} \leq C = \log_2 \binom{t+q-1}{t}. \quad (3)$$

The proof in Fu and Han Vinck shows that the capacity is the maximum total number of information bits stored in one cell during the t writes. The rate per write of a code is equivalent to the number of information bits stored per cell for the j-th write. For a t-write flash code, the sum-rate is the equivalent to the total number of information bits stored per cell during the t writes. Thus, it is reasonable to compare the sum-rate to the capacity as both expressions measure the total number of information bits stored in one cell during the t writes.

Standard digital circuitry one-hot encoding requires n=|M| bits to encode. In these embodiments one-hot coding is not used for the binary value zero, thus the total number n of wits needed for an alphabet $M_1$ is $$n=|M_1|-1. \tag{4}$$

By using just one with per write, the one-hot code will support at least $$t=n-1=|M_1|-2. \tag{5}$$

Code Construction

The general approach in the MOH coding embodiments described herein is to use a single with to encode a message at each write. For example, a decoder is provided to uniquely decode every possible combination of the codeword $\vec{c}$ for the n wits. For n wits, there are $2^n$ combinations. One embodiment does not restrict $\vec{c}$, that is, the entire cell vector space is used and any vector is a valid codeword. Such an embodiment relies on a perfect storage channel. That is, there can be no errors in storing the states of a cell. To ensure robustness and reliability, error control coding must be added on top of the storage code. This contrasts with block codes, where valid codewords ($\vec{c}$) are usually limited strictly to less than $2^n$. However, many flash codes are constructed with the foundation of block codes. A reason for this is the practical polynomial-time encoding and decoding complexities. Also, by using coset coding decomposition, it is possible to find a new codeword such that the new codeword can be written on top of the previous generation codeword. As used herein, a WOM code is modified one-hot encoded if and only if only one cell is used to encode each new message from generation to generation, and each codeword is uniquely decodable. For a $\vec{c}$ vector of weight 1 (first write), for example, there are n possible unique vectors. A MOH construction may be defined as follows:

Modified q-ary one-hot construction. Let $M_j$ be the set of messages for the j-th write. Let L be the number of messages in $M_1$ and unrestrict the subsequent (t−1) writes by reducing the size of $|M_j|$ by one message for each successive j-th write. In other words, $$|M_j|=|M_{j-1}|-1, \text{ for } j=2,\ldots,t. \tag{6}$$

Let x be defined as follows:

$$x=\lceil \log_q L \rceil. \tag{7}$$

Store a vector in $\vec{m} \in M_j$ as the message for the current j-th write and read a vector $\vec{y} \in M_{j-1}$ the message stored in the previous write. Use $\varepsilon(\vec{m})=\vec{c}$ and $D(\vec{c})=\vec{m}$ to denote the encoder and decoder, respectively. The state is raised at most one with for each write.

Remark. It is important to note here that L should be the largest information input size in bits for a given MOH code fir two reasons. First, information is mostly transmitted/stored in bits due to real-life practical convenience in digital circuitry. Second, the encoder and decoder are constructed to operate on each element over the length of a message vector. This means the same encoder/decoder is used as long as the input bits are smaller than the value of x for the subsequent j=2, ..., t, writes. However, if the input size becomes larger for each subsequent write then we may need to recalculate x to determine the appropriate length of the corresponding message vector. If the value of x increases, then the length of $\vec{c}$ will also increase and may not guarantee a successful rewrite.

Remark. The embodiment decreases the size of the information set by one, as shown in (6), to store the maximum theoretical input size fir each write of MOH code. In reality, there will be a rounding down from x to $p_j$ where $p_j=\lfloor \log_2|M_j| \rfloor$ for some subsequent j-th write. One can use a table to find the correct mapping from the x bits to $p_j$ bits. This will result in extra storage costs depending on the mapping. However, it is also possible to hardwire the mapping from x bits to $p_j$ bits in a similar fashion as Meggitt decoders by, for example, using combinatoric logic gates. Thus, it is assumed that it is possible to find a practical mapping from x bits to $p_j$ bits. An exact mapping may be determined accordingly.

Remark. It is shown below that it is possible to not decrease the information set size. This may be done by encoding more than 1 wit. It is more beneficial to encode more than 1 with during the last write(s), in terms of maximizing the number of information bits stored per cell during the last few writes. Thus, embodiments can be optimized by allowing more than 1 with to be encoded per write. However, investigations using multi-hot encoding for smaller writes (t<50) found that the sum-rate increase was only approximately 1 percent compared to one-hot encoding. Accordingly, a trade-off exists between this 1 percent sum-rate gain versus the possible increase in encoding/decoding complexity.

The q-ary MOH encoder and decoder are defined using addition and subtraction over GF(q).

Modified q-ary one-hot encoder. A 1-to-1 mapping of a vector $\vec{h}=(h_1, h_2, \ldots, h_x)$ to i, denoted by $F(\bullet)$, is defined as follows:

$$i = F(\vec{h}) \tag{8}$$
$$= \sum_{k=1}^{x} h_x q^{x-k}.$$

In other words, let a vector $\vec{h}$ represent the index i in base q where the first index of $\vec{h}$ is the most significant digit. For instance, if q=2, x=3, and $\vec{h}=(1,0,0)$, then i=4.

The MOH encoder is defined by $$\varepsilon(\vec{m})=\vec{c} \tag{9}$$

where $\vec{c}$ is the programmed cell state vector from the previous write but with the wit $c_1$ raised to the next available state. In order to find $\vec{h}$, we need to solve for each $h_k$, k=1, 2, . . . , x, over GF(q) by the following $$h_k=m_k-y_k, \text{ for } k=1,2,L,x. \tag{10}$$

Figure 2:
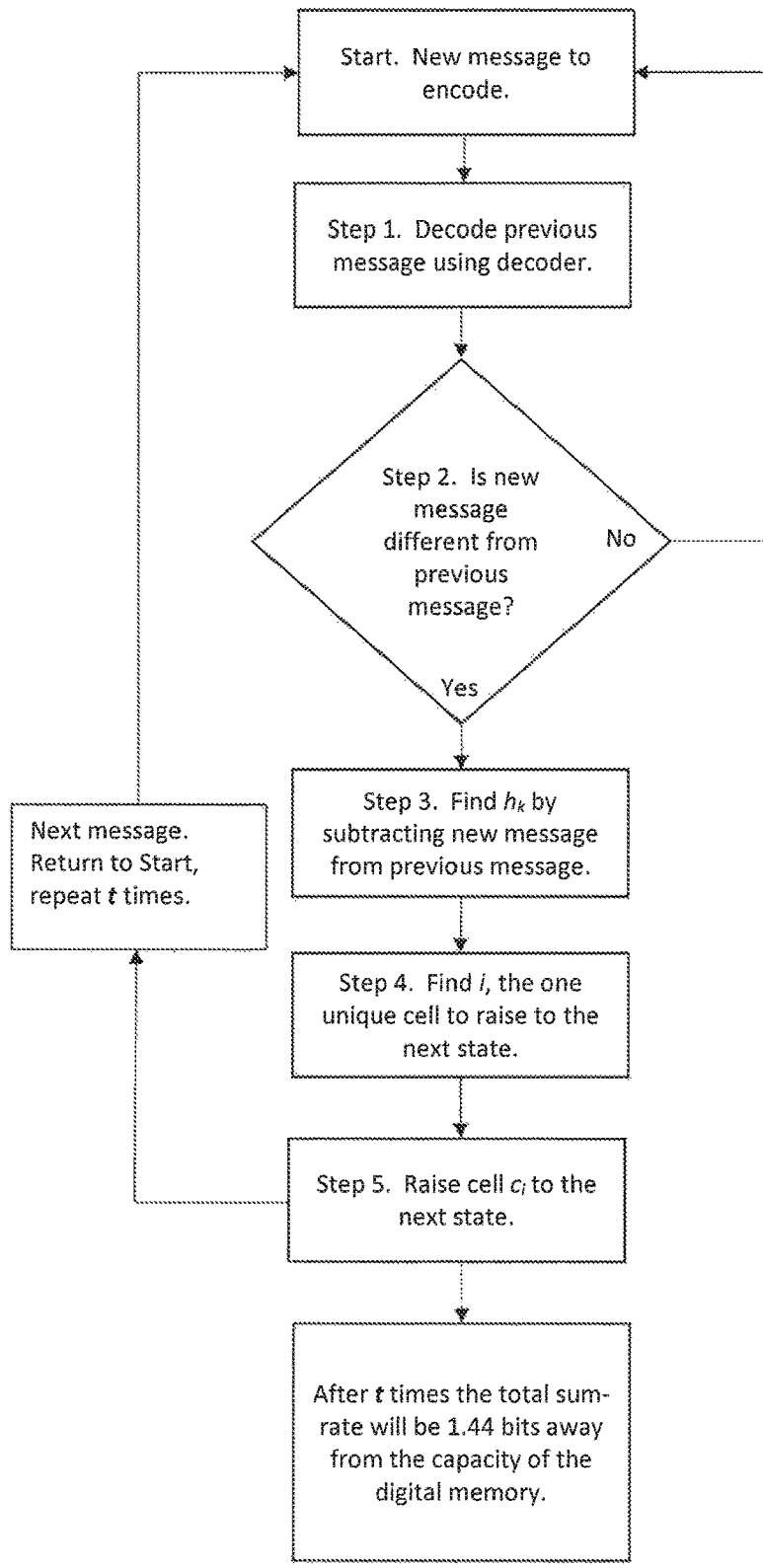
FIG. 2 is a flow chart showing a method for increasing a sum-rate of a digital memory, according to an embodiment of the invention.

Once $\vec{h}$ is found, i is determined with (8). Then $c_i$ is raised to the next state. An example of an implementation is shown in FIG. 2, and an example of an encoding sequence is summarized in Algorithm 1. This embodiment uses approximately $2\lceil \log_2 n \rceil$ FLOPs to calculate the mapping from $\vec{h}$ to i, $\lceil \log_2 n \rceil$ FLOPs to find each $h_k$, and thus requires a time complexity of $O(\log_2 n)$. The decoding complexity in Step 1 will be presented later with the decoder.

| Algorithm 1. |
| --- |
| Steps to encode a message. |
| Step 1. Decode the previous message $\vec{y}$. |
| Step 2. Determine $\vec{m}$ if the current message is the same as $\vec{y}$, do nothing if they are the same. If not, go to step 3. |
| Step 3. Find $h_k$, for k = 1,2,...,x, by using (10). |
| Step 4. Find i by using (8). |
| Step 5. Update $\vec{c}$ by raising $c_i$ to the next state. |

Modified q-ary one-hot Decoder. In one embodiment, the decoder is defined by $$D(\vec{c}) = \vec{m}. \quad (11)$$

To find $\vec{m}$, solve for each element in $\vec{m}$, denoted by $m_k$, in the following $$m_k = \sum_{i=1}^{n} c_i \cdot h_k^{(i)}, \text{ for } k = 1, 2, \ldots, x, \quad (12)$$

where $h_k^{(i)}$ is the k-th element of $\vec{h}^{(i)}$, and $\vec{c}^{(i)}$ is the vector $\vec{h}$ corresponding to i given by the mapping of (8). This embodiment works for all q≥2. The number of FLOPs needed to solve (12) is approximately 2n, thus the time complexity is $O(n \log_2 n)$ without considering the h to i mapping. With the mapping, the complexity becomes $O(n^2 \log_2 n)$.

An example of a pseudo-code for a binary MOH decoder in given in Algorithm 2.

| Algorithm 2. Binary Modified One-hot Decoder. |
| --- |
| for k = 1 to x-th power |
|   $z = \dfrac{\|M_1\|}{2^k}$ |
|   for l = 1 to $2^{(k-1)}$ |
|     Call EncFunc $\left(z, z + \dfrac{\|M\|}{2^k}\right)$ |
|     $z = z + \dfrac{\|M\|}{2^k} \times 2$ |
|     Increment l by 1 |
|   end for |
|   Increment k by 1 |
| end for |
| EncFunc (x, y) |
|   $m_k = 0$ |
|   while(x less than y) |
|     $m_k = m_k + h_x$ |
|     Increment x |
|   end while |

This means that any n-length binary MOH code can be decoded using the same decoding algorithm. Algorithms 1 and 2 may be used as shown in the next two examples. The first example is for the case when q=2 and the second example is for the case q=3.

Example 1

To illustrate a series of writes for n=7 and q=2, parameters for this code are $|M_1|=8$ and x=3 from (4) and (7). Let $\vec{y}=(0,0,0)$ be the only element in the set $M_0$ initially. Each $y_k$ is read using the decoding function $$y_k = \sum_{i=1}^{7} c_i \cdot h_k^{(i)}, \text{ for } k = 1, 2, 3.$$

Each $\vec{m}$ is stored by following the five steps from Algorithm 1. Suppose the message $\vec{m}$ changes as $$(0,0,0) \rightarrow (0,0,1) \rightarrow (1,0,0) \rightarrow (0,0,0),$$

then the states $\vec{c}=(c_1, c_2, \ldots, c_7)$ will change as $$(0, 0, 0, 0, 0, 0, 0), \quad (13)$$
$$\downarrow$$
$$(1, 0, 0, 0, 0, 0, 0), \quad (14)$$
$$\downarrow$$
$$(1, 0, 0, 0, 1, 0, 0), \quad (15)$$
$$\downarrow$$
$$(1, 0, 0, 1, 1, 0, 0). \quad (16)$$

To show (15) using Algorithm 1: Step 1 of Algorithm 1 requires decoding the previous message $\vec{y}$. Algorithm 2 may be used directly, or a $\vec{h}$ to i mapping table may be created. Choosing the latter option, the mapping of $F(\vec{h})$ is shown in Table 1.

TABLE 1

| $F(\vec{h})$, the mapping from $\vec{h}$ to i. | |
| --- | --- |
| i | $\vec{h} = (h_1, h_2, h_3)$ |
| 1 | 001 |
| 2 | 010 |
| 3 | 011 |
| 4 | 100 |
| 5 | 101 |
| 6 | 110 |
| 7 | 111 |

Start with step 1 of Algorithm 1 with the help of Table 1 as follows:

$$\vec{c} = (1, 0, 0, 0, 0, 0, 0). \quad (17)$$

$$y_k = \sum_{i=1}^{n} c_i \cdot h_k^{(i)}, \text{ for } k = 1, 2, \ldots, x,$$

$$\rightarrow y_1 = c_4 + c_5 + c_6 + c_7,$$
$$= 0.$$

$$\rightarrow y_2 = c_2 + c_3 + c_6 + c_7,$$
$$= 0.$$

$$\rightarrow y_3 = c_1 + c_3 + c_5 + c_7,$$
$$= 1.$$

In step 2, $\vec{y}=(0,0,1)$ is not the same as $\vec{m}=(1,0,0)$ so proceed to step 3 as follows:

$$h_k = m_k - y_k, \text{ for } k = 1, 2, \ldots, x. \tag{18}$$

$$\to h_1 = m_1 - y_1,$$
$$= 1.$$
$$\to h_2 = m_2 - y_2,$$
$$= 0.$$
$$\to h_1 = m_1 - y_1,$$
$$= 1.$$

Step 4 requires using Table 1 to map from $\vec{h}=(1,0,1)$ to i=5. Finally, in step 5 $c_5$ is raised by one state and $\vec{c}=(1,0,0,0,1,0,0)$ results. Next is an example for the case q=3.

Example 2

To illustrate a series of writes for n=8 and, q=3, parameters for this code are $|M_1|=9$ and x=2 from (4) and (7). Let $\vec{y}=(0,0)$ be the only element in the set $M_0$ initially. Each $y_k$ is read using the decoding function $$y_k = \sum_{i=1}^{8} c_i \cdot h_k^{(i)}, \text{ for } k = 1, 2.$$

Each $\vec{m}$ is stored using Algorithm 1. Suppose the message $\vec{m}$ changes as $$(0,0) \to (2,1) \to (1,0) \to (0,1),$$

then the states $\vec{c}=(c_1, c_2, \ldots, c_8)$ will change as $$(0, 0, 0, 0, 0, 0, 0, 0), \tag{19}$$
$$\downarrow$$
$$(0, 0, 0, 0, 0, 0, 1, 0), \tag{20}$$
$$\downarrow$$
$$(0, 0, 0, 0, 0, 0, 1, 1), \tag{21}$$
$$\downarrow$$
$$(1, 0, 0, 0, 0, 0, 1, 1). \tag{22}$$

To show (21) using Algorithm 1, the mapping of $F(\vec{h})$ is shown in Table 2.

TABLE 2

| $F(\vec{h})$, the mapping from $\vec{h}$ to i. | |
| --- | --- |
| i | $\vec{h} = (h_1, h_2)$ |
| 1 | 01 |
| 2 | 02 |
| 3 | 10 |
| 4 | 11 |
| 5 | 12 |
| 6 | 20 |
| 7 | 21 |
| 8 | 22 |

Start with step 1 of Algorithm 1 with the help of Table 2 as follows:

$$\vec{c} = (0, 0, 0, 0, 0, 0, 1, 0). \tag{23}$$

$$y_k = \sum_{i=1}^{n} c_i \cdot h_k^{(i)}, \text{ for } k = 1, 2,$$

-continued
$$\to y_1 = (c_3 + c_4 + c_5) \cdot 1 + (c_6 + c_7 + c_8) \cdot 2,$$
$$= 2.$$
$$\to y_2 = (c_1 + c_4 + c_7) \cdot 1 + (c_2 + c_5 + c_8) \cdot 2,$$
$$= 1.$$

In step 2, $\vec{y}=(2,1)$ is not the same as $\vec{m}(1,0)$ so proceed to step 3 as follows:

$$h_k = m_k - y_k, \text{ for } k = 1, 2. \tag{24}$$
$$\to h_1 = m_1 - y_1,$$
$$= 2.$$
$$\to h_2 = m_2 - y_2,$$
$$= 2.$$

Step 4 requires using Table 2 to map from $\vec{h}=(2,2)$ to i=8. Finally, in step 5 raise $c_8$ by one state and $\vec{c}=(0,0,0,0,0,0,1,1)$ results. To formulate a sum-rate expression, binary and ternary one-hot code examples are presented in the following sections.

Further examples are provided to illustrate a set of possible message vectors in each $M_j$, calculating a sum-rate for the MOH code, and determining t for a q-ary MOH code.

Example 3

This example relates to a binary MOH code. Suppose 8 data messages are to be stored initially, as in Example 1. Table 3 below shows a MOH encoding map for 8 values.

TABLE 3

| Binary MOH encoding for binary messages. | |
| --- | --- |
| Codeword $\vec{c}$ = $(c_1, c_2, \ldots, c_7)$ | Message $\vec{m}$ = $(m_1, m_2, m_3)$ |
| 0000000 | 000 |
| 1000000 | 001 |
| 0100000 | 010 |
| 0010000 | 011 |
| 0001000 | 100 |
| 0000100 | 101 |
| 0000010 | 110 |
| 0000001 | 111 |

Note that in MOH coding embodiments, the all-zero codeword (i.e., 0000000 in Table 3) is being used whereas the traditional one-hot encoder does not allow the all-zero codeword. In fact, a weight of 1 is traditionally used to encode every message and requires $n_{traditional}$ wits to encode $|M|$ messages in the traditional coding. Thus, for the same data alphabet size, the MOH coding always uses one fewer wit in the codeword compared to the traditional one. In mathematical terms, MOH code according to these embodiments uses $$n=|M|-1$$

wits. The decoder D: $\vec{c} \to \vec{m}$ takes the states of the 7 cells as a vector $\vec{c}$ and outputs a 3 bit vector $\vec{m}$. Using (12), the specific decoder to find each $m_k$, for k=1, 2, 3, is simplified as $$m_1 = c_4 + c_5 + c_6 + c_7,$$

$m_2 = c_2 + c_3 + c_6 + c_7,$ $m_3 = c_1 + c_3 + c_5 + c_7.$

Using Table 3, it is verified that this decoder is valid for the MOH encoding scheme. Parameters for this code are n=7, and t=6 from (4) and (5). It will be shown why t≠7 below.

That is, a 6-write binary WOM code using 7 wits is constructed to store information.

Illustrated next is a series of encoding tables for 6 writes. Table 4 shows the i-th highlighted with to encode to store a message vector $\vec{m}$ for the first write. We see $\{c_i\}_{i=1}^n$ from Table 4 for all entries agrees with (12).

TABLE 4

| Encoding map for the first write. | | | | | | | |
|---|---|---|---|---|---|---|---|
| From $\vec{y}$/To $\vec{m}$ | 001 | 010 | 011 | 100 | 101 | 110 | 111 |
| 000 | 1000000 | 0100000 | 0010000 | 0001000 | 0000100 | 0000010 | 0000001 |

For example, suppose $\vec{m}=(1,1,1)$ is to be stored in the first write. The initial erased cell state vector is $\vec{c}=(0,0,0,0,0,0,0)$ and $D(\vec{c})=(0,0,0)$. Using (10), $\vec{h}=(1,1,1)$ which corresponds to the seventh cell. In Table 4 the seventh cell is highlighted when the message (1,1,1) is stored. Thus 8 different messages are stored in the first write, and nothing is done to $\vec{c}$ if $\vec{m}=(0,0,0)$ is to be stored in the first write. Now unrestrict the second write to store as much information as possible. Table 5 below shows the encoding map for the second write.

TABLE 5

| Encoding map for the second write. | | | | | | | |
|---|---|---|---|---|---|---|---|
| From $\vec{y}$/To $\vec{m}$ | 001 | 010 | 011 | 100 | 101 | 110 | 111 |
| D (1000000) = 001 | na | 1010000 | 1100000 | 1000100 | 1001000 | 1000001 | 1000010 |
| D (0100000) = 010 | 0110000 | na | 1100000 | 0100010 | 0100001 | 0101000 | 0100100 |
| D (0010000) = 011 | 0110000 | 1010000 | na | 0010001 | 0010010 | 0010100 | 0011000 |
| D (0001000) = 100 | 0001100 | 0001010 | 0001001 | na | 1001000 | 0101000 | 0011000 |
| D (0000100) = 101 | 0001100 | 0000101 | 0000110 | 1000100 | na | 0010100 | 0100100 |
| D (0000010) = 110 | 0000011 | 0001010 | 0000110 | 0100010 | 0010010 | na | 1000010 |
| D (0000001) = 111 | 0000011 | 0000101 | 0001001 | 0010001 | 0100001 | 1000001 | na |

The first column in Table 5 shows the possible states for each $\vec{c}$ and the decoded $\vec{y}$ message after the first write. The first row in Table 5 shows the possible messages $\vec{m}$ that can be written. The remaining columns show the highlighted i-th with to program to store a new message $\vec{m}$. If the message does not change, then there are no changes to $\vec{c}$. This is denoted by na. Thus, 7 different messages are provided to store for the second write.

TABLE 6

| Encoding map for the third write. | | | | | | | |
|---|---|---|---|---|---|---|---|
| From $\vec{y}$/To $\vec{m}$ | 001 | 010 | 011 | 100 | 101 | 110 | 111 |
| D (0110000) = 001 | na | | | 0110100 | 0111000 | 0110001 | 0110010 |
| D (0001100) = 001 | na | 0011100 | 0101100 | | | 0001101 | 0001110 |
| D (0000011) = 001 | na | 0010011 | 0100011 | 0000111 | 0001011 | | |
| D (1010000) = 010 | | na | | 1010010 | 1010001 | 1011000 | 1010100 |
| D (0001010) = 010 | 0011010 | na | 1001010 | | 0001011 | | 0001110 |
| D (0000101) = 010 | 0010101 | na | 1000101 | 0000111 | | 0001101 | |
| D (1100000) = 011 | | | na | 1100001 | 1100010 | 1100100 | 1101000 |
| D (0001001) = 011 | 0101001 | 1001001 | na | | 0001011 | 0001101 | |
| D (0000110) = 011 | 0100110 | 1000110 | na | | 0000111 | | 0001110 |
| D (1000100) = 100 | | 1000110 | 1000101 | na | | 1100100 | 1010100 |
| D (0100010) = 100 | 0100110 | | 0100011 | na | 1100010 | | 0110010 |
| D (0010001) = 100 | 0010101 | 0010011 | | na | 1010001 | 0110001 | |
| D (1001000) = 101 | | 1001001 | 1001010 | | na | 1011000 | 1101000 |
| D (0100001) = 101 | 0101001 | | 0100011 | 1100001 | na | 0110001 | |
| D (0010010) = 101 | 0011010 | 0010011 | | 1010010 | na | | 0110010 |

TABLE 6-continued

Encoding map for the third write.

| From $\vec{y}$/To $\vec{m}$ | 001 | 010 | 011 | 100 | 101 | 110 | 111 |
|---|---|---|---|---|---|---|---|
| D (1000001) = 110 | | 1001001 | 1000101 | 1100001 | 1010001 | na | |
| D (0101000) = 110 | 0101001 | | 0101100 | | 0111000 | na | 1101000 |
| D (0010100) = 110 | 0010101 | 0011100 | | 0110100 | | na | 1010100 |
| D (1000010) = 111 | | 1000110 | 1001010 | 1010010 | 1100010 | | na |
| D (0100100) = 111 | 0100110 | | 0101100 | 0110100 | | 1100100 | na |
| D (0011000) = 111 | 0011010 | 0011100 | | | 0111000 | 1011000 | na |

Table 6 shows the all possible encoding for the third write. The blank entries in the tables represent the rate loss for the j-th write due to an unwritable message. With each write, the cardinality of $M_j$ is reduced and a mapping from the acceptable n-tuples to p-tuples is established, where $p_j = \log_2 |M_j|$, for $j \neq 1$. In practice, this means accept 3 bits of input information but will need to round down to the nearest power of q. This means 2 bits of input information for the subsequent writes until the need to round down to 1 bit. This can be done via a table or proper combinatorial logic designs such as, for example, those used for Meggit decoders. However, it may be assumed that information input does not need to be in powers of q and the mapping from a larger data set to a smaller data set is well defined. Thus, it may be assumed that the controller knows to restrict the input message corresponding to each blank entry in subsequent encoding tables.

The encoding maps for the fourth, fifth, and sixth writes are shown in Tables 7-9, and the encoding map for $\vec{m} = (0,0,0)$ is shown later on.

TABLE 7

Encoding map for the fourth write.

| From $\vec{y}$/To $\vec{m}$ | 001 | 010 | 011 | 100 | 101 | 110 | 111 |
|---|---|---|---|---|---|---|---|
| D (0011010) = 001 | na | | 0111010 | 0011110 | | 0011011 | |
| D (0010101) = 001 | na | | 0110101 | | 0011101 | | 0010111 |
| D (0101001) = 001 | na | 0111001 | | 0101101 | | | 0101011 |
| D (0100110) = 001 | na | 0110110 | | | | 0101110 | 0100111 |
| D (0011100) = 010 | | na | 1011100 | 0011110 | 0011101 | | |
| D (1001001) = 010 | 1011001 | na | | 1001011 | | | 1001101 |
| D (1000110) = 010 | 1010110 | na | | | 1000111 | 1001110 | |
| D (0010011) = 010 | | na | 1010011 | | | 0011011 | 0010111 |
| D (0101100) = 011 | | 1101100 | na | 0101101 | 0101110 | | |
| D (0100011) = 011 | | 1100011 | na | | | 0100111 | 0101011 |
| D (1001010) = 011 | 1101010 | | na | 1001011 | | 1001110 | |
| D (1000101) = 011 | 1100101 | | na | | 1000111 | | 1001101 |
| D (0110100) = 100 | | 0110110 | 0110101 | na | 1110100 | | |
| D (0000111) = 100 | | | | na | 1000111 | 0100111 | 0010111 |
| D (1010010) = 100 | 1010110 | | 1010011 | na | | 1110010 | |
| D (1100001) = 100 | 1100101 | 1100011 | | na | | | 1110001 |
| D (0111000) = 101 | | 0111001 | 0111010 | 1111000 | na | | |
| D (0001011) = 101 | | | | 1001011 | na | 0011011 | 0101011 |
| D (1010001) = 101 | 1011001 | | 1010011 | | na | | 1110001 |
| D (1100010) = 101 | 1101010 | 1100011 | | | na | 1110010 | |
| D (0110001) = 110 | | 0111001 | 0110101 | | | na | 1110001 |
| D (0001101) = 110 | | | | 0101101 | 0011101 | na | 1001101 |
| D (1011000) = 110 | 1011001 | | 1011100 | 1111000 | | na | |
| D (1100100) = 110 | 1100101 | 1101100 | | | 1110100 | na | |
| D (0110010) = 111 | | 0110110 | 0111010 | | | 1110010 | na |
| D (0001110) = 111 | | | | 0011110 | 0101110 | 1001110 | na |
| D (1010100) = 111 | 1010110 | | 1011100 | | 1110100 | | na |
| D (1101000) = 111 | 1101010 | 1101100 | | 1111000 | | | na |

TABLE 8

Encoding map for the fifth write.

| From $\vec{y}$/To $\vec{m}$ | 001 | 010 | 011 | 100 | 101 | 110 | 111 |
|---|---|---|---|---|---|---|---|
| D (1011001) = 001 | na | | 1111001 | 1011101 | | | 1011011 |
| D (1010110) = 001 | na | | 1110110 | | 1011110 | 1010111 | |
| D (1101010) = 001 | na | 1111010 | | 1101110 | | 1101011 | |
| D (1100101) = 001 | na | 1110101 | | | 1101101 | | 1100111 |
| D (0111001) = 010 | | na | 1111001 | 0111101 | | | 0111101 |
| D (0110110) = 010 | | na | 1110110 | | 0110111 | 0111110 | |
| D (1101100) = 010 | 1111100 | na | | 1101110 | 1101101 | | |
| D (1100011) = 010 | 1110011 | na | | | | 1101011 | 1100111 |
| D (0111010) = 011 | | 1111010 | na | 0111011 | | 0111110 | |
| D (0110101) = 011 | | 1110101 | na | | 0110111 | | 0111101 |

TABLE 8-continued

Encoding map for the fifth write.

| From $\vec{y}$/To $\vec{m}$ | 001 | 010 | 011 | 100 | 101 | 110 | 111 |
|---|---|---|---|---|---|---|---|
| D (1011100) = 011 | 1111100 | | | na | 1011101 | 1011110 | |
| D (1010011) = 011 | 1110011 | | | na | | 1010111 | 1011011 |
| D (0011110) = 100 | | | 0011111 | na | 1011110 | 0111110 | |
| D (0101101) = 100 | | 0101111 | | na | 1101101 | | 0111101 |
| D (1001011) = 100 | 1001111 | | | na | | 1101011 | 1011011 |
| D (1111000) = 100 | 1111100 | 1111010 | 1111001 | na | | | |
| D (0011101) = 101 | | | 0011111 | 1011101 | n | | 0111101 |
| D (0101110) = 101 | | 0101111 | | 1101110 | na | 0111110 | |
| D (1000111) = 101 | 1001111 | | | | na | 1010111 | 1100111 |
| D (1110100) = 101 | 1111100 | 1110101 | 1110110 | | na | | |
| D (0011011) = 110 | | | 0011111 | 0111011 | | na | 1011011 |
| D (0100111) = 110 | | 0101111 | | | 0110111 | na | 1100111 |
| D (1001110) = 110 | 1001111 | | | 1101110 | 1011110 | na | |
| D (1110010) = 110 | 1110011 | 1111010 | 1110110 | | | na | |
| D (0010111) = 111 | | | 0011111 | | 0110111 | 1010111 | na |
| D (0101011) = 111 | | 0101111 | | 0111011 | | 1101011 | na |
| D (1001101) = 111 | 1001111 | | | 1011101 | 1101101 | | na |
| D (1110001) = 111 | 1110011 | 1110101 | 1111001 | | | | na |

TABLE 9

Encoding map for the sixth write.

| From $\vec{y}$/To $\vec{m}$ | 001 | 010 | 011 | 100 | 101 | 110 | 111 |
|---|---|---|---|---|---|---|---|
| D (1111100) = 001 | na | | | | | 1111101 | 1111110 |
| D (1110011) = 001 | na | | | 1110111 | 1111011 | | |
| D (1001111) = 001 | na | 1011111 | 1101111 | | | | |
| D (1111010) = 010 | | na | | | 1111011 | | 1111110 |
| D (1110101) = 010 | | na | | 1110111 | | 1111101 | |
| D (0101111) = 010 | 0111111 | na | 1101111 | | | | |
| D (1111001) = 011 | | | na | | 1111011 | 1111101 | |
| D (1110110) = 011 | | | na | 1110111 | | | 1111110 |
| D (0011111) = 011 | 0111111 | 1011111 | na | | | | |
| D (1011101) = 100 | | 1011111 | | na | | 1111101 | |
| D (1101110) = 100 | | | 1101111 | na | | | 1111110 |
| D (0111011) = 100 | 0111111 | | | na | 1111011 | | |
| D (1011110) = 101 | | 1011111 | | | na | | 1111110 |
| D (0110111) = 101 | 0111111 | | | 1110111 | na | | |
| D (1101101) = 101 | | | 1101111 | | na | 1111101 | |
| D (1010111) = 110 | | 1011111 | | 1110111 | | na | |
| D (1101011) = 110 | | | 1101111 | | 1111011 | na | |
| D (0111110) = 110 | 0111111 | | | | | na | 1111110 |
| D (1011011) = 111 | | 1011111 | | | 1111011 | | na |
| D (0111101) = 111 | 0111111 | | | | | 1111101 | na |
| D (1100111) = 111 | | | 1101111 | 1110111 | | | na |

Now analyze the encoding maps for each write. The $c_i$-th with to program for each previous message-to-current message for all 6 writes is recorded in Table 10.

TABLE 10

Encoding for each message.

| From $\vec{y}$/To $\vec{m}$ | 001 | 010 | 011 | 100 | 101 | 110 | 111 |
|---|---|---|---|---|---|---|---|
| 001 | na | $c_3$ | $c_2$ | $c_5$ | $c_4$ | $c_7$ | $c_6$ |
| 010 | $c_3$ | na | $c_1$ | $c_6$ | $c_7$ | $c_4$ | $c_5$ |
| 011 | $c_2$ | $c_1$ | na | $c_7$ | $c_6$ | $c_5$ | $c_4$ |
| 100 | $c_5$ | $c_6$ | $c_7$ | na | $c_1$ | $c_2$ | $c_3$ |
| 101 | $c_4$ | $c_7$ | $c_6$ | $c_1$ | na | $c_3$ | $c_2$ |
| 110 | $c_7$ | $c_4$ | $c_5$ | $c_2$ | $c_3$ | na | $c_1$ |
| 111 | $c_6$ | $c_5$ | $c_4$ | $c_3$ | $c_2$ | $c_1$ | na |

We see $\{c_i\}_{i=1}^n$ from Table 10 for all entries agree with (10). The analysis was stopped at 6 writes because two wits are used for the last write to include storing the message $\vec{m}=(0,0,0)$. This is because only $\vec{c}=(1,1,1,1,1,1,1)$ can be written for the seventh write otherwise. A goal of the embodiments is to maximize the sum-rate for a t-write code. By allowing two wits for the last write, higher sum-rates in terms of t writes are achieved. This is shown below in the binary code analysis section. The results from Table 4 to Table 9 show that there are 16 unique vectors $\vec{c}$ for each $\vec{m}$ message. Since there are $2^7=128$ total unique $\vec{c}$ vectors, there must be 16 left to represent $\vec{m}=(0,0,0)$. The 16 unique vectors that decode to in $\vec{m}=(0,0,0)$ are shown in Table 11 below. Thus, $\vec{m}=(0,0,0)$ may be stored in 4 different generations.

TABLE 11

All vectors that decode to $\vec{m} = (0, 0, 0)$.

| | | | | | | | |
|---|---|---|---|---|---|---|---|
| 0000000 | 1111111 | 0111100 | 1000011 | 0001111 | 1110000 | 1001100 | 0110011 |
| 1010101 | 0101010 | 0011001 | 1100110 | 0100110 | 1011001 | 0101001 | 1010110 |

From the encoding map tables, it is clear that to store the message vector (0,0,0) from a message vector $\vec{y}$, the i-th with corresponding to $\vec{h}=\vec{y}$ must be encoded. This is summarized below.

TABLE 12

Writing for $\vec{m} = (0, 0, 0)$.

| To $\vec{m}$/From $\vec{y}$ | 001 | 010 | 011 | 100 | 101 | 110 | 111 |
|---|---|---|---|---|---|---|---|
| 000 | $c_1$ | $c_2$ | $c_3$ | $c_4$ | $c_5$ | $c_6$ | $c_7$ |

Again, the entries for $\{c_i\}_{i-1}^n$ in Table 12 agree with (10).

Sum-Rate Analysis for Binary Codes

A sum-rate expression for binary MOH code is presented. For any n, there are exactly t=n−1 writes. For each successive j-th write, decrease in data size by 1, as given by (6). This was shown in Example 3.

Then obtain a simplified sum-rate expression for our MOH code, $R_{MOH}$, as follows:

$$R_{MOH} = \sum_{j=1}^{t} \frac{\log_2|M_j|}{n}. \quad (25)$$

In Example 3, calculate the sum-rate for a binary MOH code with n=7 cells using the following $|M_j|$:

$|M_1|=8$, $|M_2|=7$, $|M_3|=6$, $|M_4|=5$, $|M_5|=4$, $|M_6|=4$, for the 6 writes. This equates to a sum-rate of 2.102 using (25). Recall from Table 9 that the sixth write can store 3 different messages using 1 wit. However, two wits may be used for the sixth write. This is discussed with reference to Table 13.

TABLE 13.1

Sum-rates of binary MOH codes by using
1 wit or 2 wits for the last write.

| n = 6 and t = 6 | n = 7 and t = 6 | n = 7 and t = 7 | n = 8 and t = 7 |
|---|---|---|---|
| 2.05 | 2.102 | 2.1856 | 2.2355 |

The second column in Table 13 shows the sum-rate of the binary code from. Example 1 as calculated using (25). The third column with n=7 and t=7 shows a larger sum-rate than column two. However, column 1 with n=6 and t=6 has a lower sum-rate than column two. This means if a designer of a MOH code wants to achieve a higher sum-rate in terms of t, the last write should use 2 wits. On the other hand, to achieve a higher sum-rate in terms of n, one with should be used for all writes. An embodiment allowing two-wit encoding for only the last write would require the lowest overhead and is the most likely scenario. This is because the encoder may be instructed to use two-wit encoding once a data alphabet of size 3 in reached. This would mean the second-to-last write available is reached.

Figure 3:
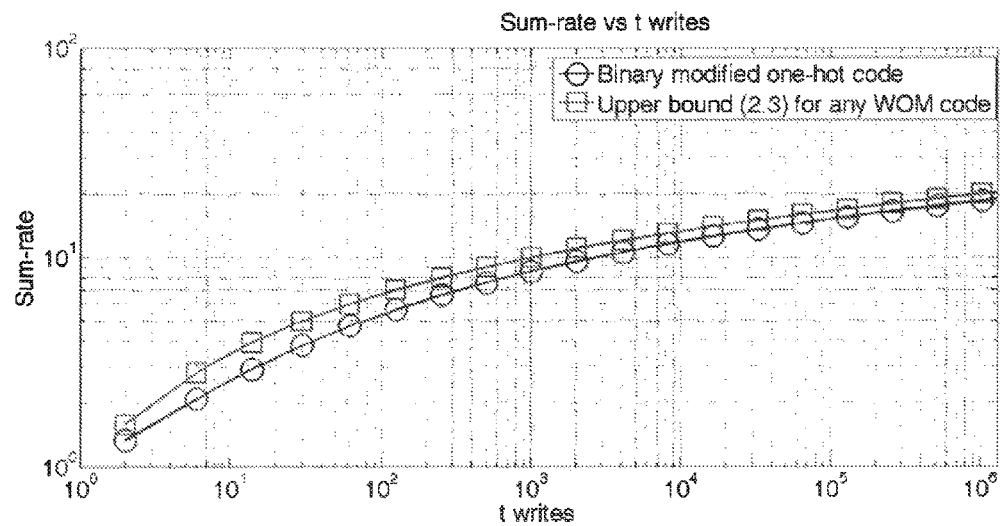
FIG. 3 is a plot of sum-rates for a binary MOH code and the upper-bound for WOM codes.

Performance of a binary MOH code is shown in FIG. 3. Equation (25) was used to calculate the points for the plot of the dashed curve for various t writes. Equation (3) was used to calculate the upper-bound of sum-rates for any WOM code for the shown number of t writes. Let Fq, q=2, 3, . . . , represent the asymptotic q-ary gap to capacity constant as t goes to infinity. $F_2$ denotes the binary gap to capacity constant as follows:

$$F_2 = C - R_{MOH} \quad (26)$$

$$= \lim_{t \to \infty} \left[ l - g_2(1+t) - \sum_{j=1}^{t} \frac{\log_2|M_j|}{n} \right]$$

$$= \frac{1}{\ln 2} \approx 1.44.$$

Proof. Using change of variable $|M_j|=l$ in the above e sum, $$\lim_{t \to \infty} \left[ \log_2(1+t) - \sum_{j=1}^{t} \frac{\log_2|M_j|}{t} \right] = \lim_{t \to \infty} \left[ \log_2(1+t) - \sum_{l=1}^{t+1} \frac{\log_2(l)}{t} \right] \quad (27)$$

$$= \lim_{t \to \infty} \left[ \log_2(1+t) - \frac{\log_2\left(\prod_{l=2}^{t+1} l\right)}{t} \right] \quad (28)$$

$$= \lim_{t \to \infty} \left[ \log_2(1+t) - \frac{\log_2((t+1)!)}{t} \right] \quad (29)$$

$$= \lim_{t \to \infty} \frac{\log_2 \frac{(t+1)^{t-1}}{t!}}{t} \quad (30)$$

$$= \lim_{t \to \infty} \log_2 \frac{(t+1)^{\frac{t-1}{t}}}{\sqrt[t]{t!}} \quad (31)$$

$$= \log_2 \lim_{t \to \infty} \frac{(t+1)^{\frac{t-1}{t}}}{\sqrt[t]{t!}} \quad (32)$$

$$= \log_2 \lim_{t \to \infty} \frac{t+1}{\sqrt[t]{t!}} \quad (33)$$

$$= \log_2 \lim_{t \to \infty} \frac{t}{\sqrt[t]{t!}} \quad (34)$$

$$= \log_2(e), \quad (35)$$

where the last equality follows by the fact that $$\lim_{t \to \infty} \frac{t}{\sqrt[t]{t!}} = e$$

and (32) follows from the following theorem (Limit of Composite Function): If $\lim g(x)=a$ and function $f$ is continuous at a, it follows that $\lim f[g(x)]=f[\lim g(x)]$.

Figure 4:
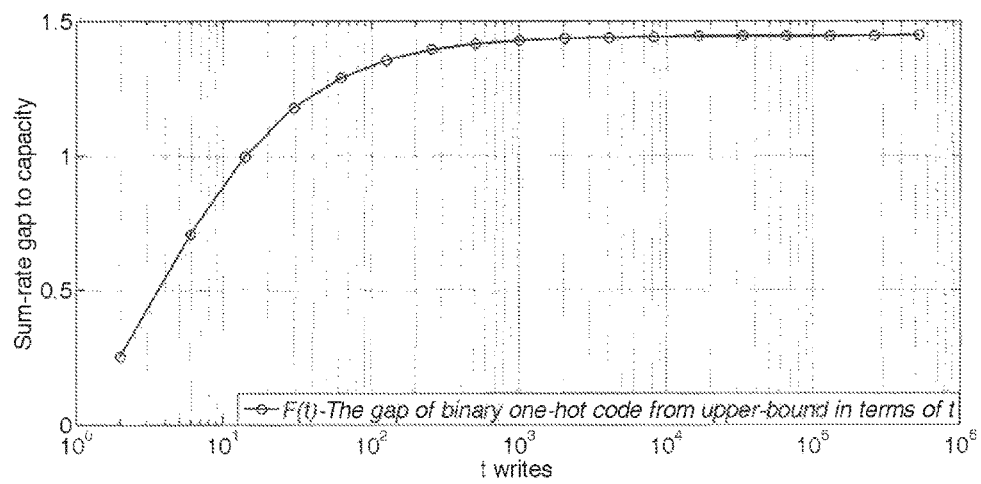
FIG. 4 is a plot of the difference between the capacity and MOH sum-rate for various t values.

FIG. 4 is a plot of the difference between the capacity and the achieved sum-rates for t values up to 524,286. The numerical results from FIG. 4 illustrate a ceiling starting at $t=10^3$ with 1.44 sum-rate distance. Thus, the achieved sum-rate will reach the best gap to capacity when n≈1000 wits in the worst case. Modified binary one-hot code is thus a near-capacity-achieving code.

Figure 5:
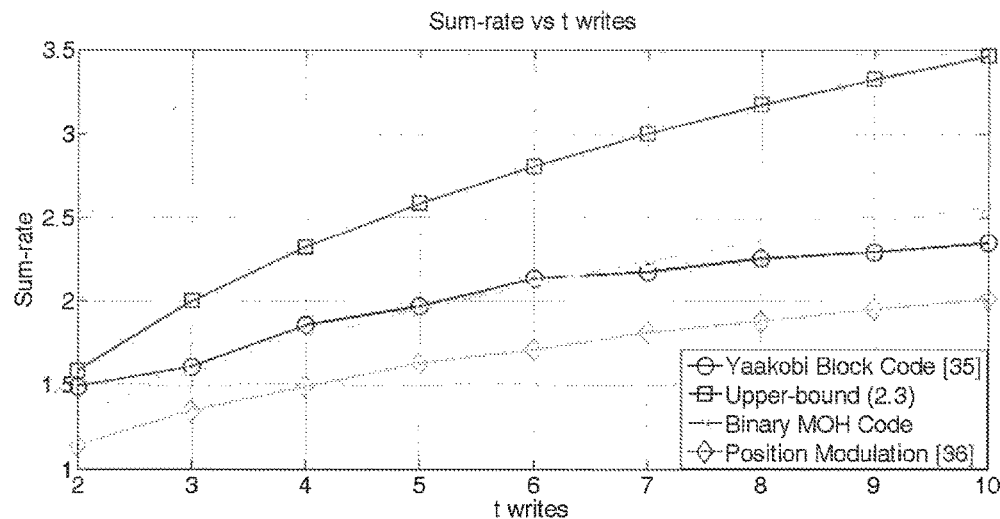
FIG. 5 is a plot showing sum-rates achieved by prior art methods and an MOH code according to one embodiment.

Performance for smaller t writes will now be described. FIG. 5 shows the highest previously reported sum-rates for t≤10.

Yaakobi's (Yaakobi and Shpilka, *Proceedings of the 2012 IEEE Int. Symp. on Inform. Theory, ISIT2012, Cambridge, U.S.A*, pp. 1386-1390, 2012) construction shows an unpredictable sum-rate curve as t is increased. This is because the rates from Yaakobi's construction were found through a computer search. Thus the structure of the code changes for different t-write codes. Conversely, MOH code embodiments and the position modulation code shows a smooth increase as t is increased. This is because the same encoder and decoder expressions can be adapted for increasing block sizes. Thus the rate-loss scales in proportion to t and n. Conversely, the encoder and decoder is vastly different for each t-write code constructed by Yaakobi, thus the amount of overhead (rate-loss) is harder to generalize. The gap in sum-rate between MOH code embodiments and the position modulation code widens as the value of t is increased. For example, at t=50, an MOH code can achieve a sum-rate of 4.3385 compared to a sum-rate of 2.8 achieved by the position modulation code.

while also allowing a larger number of writes, and achieve the highest sum-rates for t>6 writes. This translates into a longer life cycle for a flash memory device, as the need for an erasure is delayed. MOH coding also uses at least (n−1) of the n wits per erasure. This means that over time, nearly all of the floating gate cells will reach failure at the same time for each n block.

A q-ary MOH code embodiment is compared to the stacked WOM constructions in the next section, starting with a ternary example.

Ternary Modified One-Hot Codes

A ternary MOH code embodiment is presented to show the size of the data set for each successive write. This will aid in calculating achievable sum-rates. Encoding maps are shown where the procedure is parallel to the binary code in Example 3.

Example 4

To store, e.g., 9 messages in the first write, n=8 from (4). A ternary decoder for a message vector $\vec{m}$ in over GF(3) is $$m_1 = (c_3 + c_4 + c_5) \cdot 1 + (c_6 + c_7 + c_8) \cdot 2,$$

$$m_2 = (c_1 + c_4 + c_7) \cdot 1 + (c_2 + c_5 + c_8) \cdot 2,$$

which is a simplified expression for (12). A MOH encoding for ternary messages is shown in Table 15.

TABLE 14

Block sizes for various t write codes for MOH and position modulation code.

| t writes | 2 | 3 | 4 | 5 | 6 | 7 | 8 | 9 | 10 |
|---|---|---|---|---|---|---|---|---|---|
| Position modulation n value [10] | 98 | 124 | 150 | 172 | 196 | 216 | 238 | 258 | 278 |
| MOH: code n value | 3 | 4 | 5 | 6 | 7 | 8 | 9 | 10 | 11 |

Table 14 shows the block sizes used for each t-write code for position modulation and an MOH code embodiment. No comparison was made with Yaakobi's block size as the values were not clearly reported aside from their 2-write code which used a block size of 33 wits. From Table 14 and FIG. 5, it can be seen that the MOH code embodiment achieves higher sum-rates while using small block sizes for each t-write WOM code. In general, the larger the block size used results in a higher sum-rate achieved. Thus, for a comparable value of n, a MOH embodiment can extend the life cycle of a flash device by allowing more writes and store more information bits per cell when compared to position modulation code.

Remark. In general, MOH code embodiments have a lower rate loss in between each consecutive write in comparison to other unrestricted codes. This can be easily seen by the fact that the data information set size decreases by one for each write. On the other hand, Yadkobi's code construction usually has a higher rate loss in between writes. This means most of the stored information bits per cell is achieved in the first half of a t-write code. For example, for a 6-write Yaakobi WOM code, the rate loss between the fourth write to the fifth write is 0.1216. In comparison, the rate loss between the fourth and fifth write of a 6-write MOH code embodiment is just 0.046.|

In summary, for a block size of n cells, MOH coding embodiments as described herein achieve larger sum-rates,

TABLE 15

Modified one-hot encoding for ternary messages.

| Codewords $\vec{c}$ = $(c_1, c_2, \ldots, c_8)$ | Message $\vec{m}$ = $(m_1, m_2)$ |
|---|---|
| 00000000 | 00 |
| 10000000 | 01 |
| 01000000 | 02 |
| 00100000 | 10 |
| 00010000 | 11 |
| 00001000 | 12 |
| 00000100 | 20 |
| 00000010 | 21 |
| 00000001 | 22 |

As with the binary example, the encoding map for the second and third write will be shown. Table 16 shows the encoding map for the second write for a ternary MOH codes. The first column again shows the message corresponding to the states of $\vec{c}$ after the previous write. The term $\varepsilon(\vec{m}) = \vec{c}$ is used in the first columns of the encoding tables in this example due to the limited space available. Note that the highest state "2" for any with is not reached until the second write at the earliest. Table 16 also shows that the available messages to be stored is the same as the first write. In other words $|M_1|=|M_2|$. Table 17 shows the encoding map for the third write. For the third write, $|M_1|-1$ different messages are stored.

TABLE 16

Second write for ternary code.

| From $\vec{y}$/To $\vec{m}$ | 00 | 01 | 02 | 10 | 11 | 12 | 20 | 21 | 22 |
|---|---|---|---|---|---|---|---|---|---|
| ε(01) = 10000000 | 11000000 | na | 20000000 | 10001000 | 10100000 | 10010000 | 10000001 | 10000100 | 10000010 |
| ε(02) = 01000000 | 11000000 | 02000000 | na | 01010000 | 01001000 | 01100000 | 01000010 | 01000001 | 01000100 |
| ε(10) = 00100000 | 00100100 | 00100010 | 00100001 | na | 10100000 | 01100000 | 00200000 | 00110000 | 00101000 |
| ε(11) = 00010000 | 00010100 | 00010010 | 00010010 | 01010000 | na | 10010000 | 00011000 | 00110000 | 00020000 |
| ε(12) = 00001000 | 00001010 | 00001001 | 00001100 | 10001000 | 01001000 | na | 00011000 | 00002000 | 00101000 |
| ε(20) = 00000100 | 00100100 | 00010100 | 00001100 | 00000200 | 00000110 | 00000101 | na | 10000100 | 01000100 |
| ε(21) = 00000010 | 00001010 | 00100010 | 00010010 | 00000011 | 00000110 | 00000020 | 01000010 | na | 10000010 |
| ε(22) = 00000001 | 00010001 | 00001001 | 00100001 | 00000011 | 00000002 | 00000101 | 10000001 | 01000001 | na |

TABLE 17

Third write for ternary code.

| From $\vec{y}$/To $\vec{m}$ | 00 | 01 | 02 | 10 | 11 | 12 | 20 | 21 | 22 |
|---|---|---|---|---|---|---|---|---|---|
| ε(00) = 11000000 | na | 21000000 | 12000000 | 11100000 | 11010000 | 11001000 | 11000100 | 11000010 | 11000001 |
| ε(00) = 00100100 | na | 10100100 | 01100100 | 00200100 | 00110100 | 00101100 | 00100200 | 00100110 | 00100101 |
| ε(00) = 00001010 | na | 10001010 | 01001010 | 00101010 | 00011010 | 00002010 | 00001110 | 00001020 | 00001011 |
| ε(00) = 00010001 | na | 10010001 | 01010001 | 00110001 | 00020001 | 00011001 | 00010101 | 00010011 | 00010002 |
| ε(01) = 02000000 | na | | 12000000 | 00001000 | 02100000 | 02010000 | 02000001 | 02000100 | 02000010 |
| ε(01) = 00100010 | 01100010 | na | 10100010 | 00101010 | 00200010 | 00110010 | 00100011 | 00100110 | 00100020 |
| ε(01) = 00010100 | 01010100 | na | 10010100 | 00011100 | 00110100 | 00020100 | 00010101 | 00010200 | 00010110 |
| ε(01) = 00001001 | 01001001 | na | 10001001 | 00002001 | 00101001 | 00011001 | 00001002 | 00001101 | 00001011 |
| ε(02) = 20000000 | | 21000000 | na | 20010000 | 20001000 | 20100000 | 20000010 | 20000001 | 20000100 |
| ε(02) = 00100001 | 10100001 | 01100001 | na | 00110001 | 00101001 | 00200001 | 00100001 | 00100002 | 00100101 |
| ε(02) = 00010010 | 10010010 | 01010010 | na | 00020010 | 00011010 | 00110010 | 00010020 | 00010011 | 00010110 |
| ε(02) = 00001100 | 10001100 | 01001100 | na | 00011100 | 00002100 | 00101100 | 00001110 | 00001101 | 00001200 |
| ε(10) = 10001100 | 10001100 | 10001010 | 10001001 | na | 20001000 | 11001000 | 10101000 | 10011000 | 10002000 |
| ε(10) = 01010000 | 01010100 | 01010010 | 01010001 | na | 11010000 | 02010000 | 01110000 | 01020000 | 01011000 |
| ε(10) = 00000011 | 00000111 | 00000021 | 00000012 | na | 10000011 | 01000011 | 00100011 | 00010011 | 00001011 |
| ε(10) = 00000200 | | 00000210 | 00000201 | na | 10000200 | 01000200 | 00100200 | 00010200 | 00001200 |
| ε(11) = 10100001 | 10100001 | 10100010 | 10100010 | 11100000 | na | 20100000 | 10101000 | 10200000 | 10110000 |
| ε(11) = 01001000 | 01001001 | 01001001 | 01001010 | 02001000 | na | 11001000 | 01002000 | 01101000 | 01002000 |
| ε(11) = 00000110 | 00000111 | 00000210 | 00000120 | 01000110 | na | 10000110 | 00001110 | 00100110 | 00010110 |
| ε(11) = 00000002 | | 00000102 | 00000012 | 01000002 | na | 10000002 | 00001002 | 00100002 | 00010002 |
| ε(12) = 10010000 | 10010010 | 10010001 | 10010100 | 20010000 | 11010000 | na | 10020000 | 10011000 | 10110000 |
| ε(12) = 01100000 | | 01100010 | 01110100 | 11100000 | 02100000 | na | 01110000 | 01101000 | 01200000 |
| ε(12) = 00000101 | 00000111 | 00000102 | 00000201 | 10000101 | 01000101 | na | 00010101 | 00001101 | 00100101 |
| ε(12) = 00000020 | | 000000201 | 00000120 | 10000020 | 01000020 | na | 00010020 | 00001020 | 00100020 |
| ε(20) = 01000100 | 01100100 | 01010100 | 01001100 | 01000200 | 01000110 | 01000101 | na | 11000100 | 02000100 |
| ε(20) = 10000001 | 10100001 | 10001001 | 10001001 | 10000101 | 10000011 | 10000002 | na | 20000001 | 11000001 |
| ε(20) = 00200000 | | 00210000 | 00201000 | 00200100 | 00200010 | 00200001 | na | 10200000 | 01200000 |
| ε(20) = 00011000 | 00111000 | 00021000 | 00012000 | 00011100 | 00011010 | 00011001 | na | 10011000 | 01011000 |
| ε(21) = 10000100 | 10001100 | 10100100 | 10010100 | 10000101 | 10000200 | 10000110 | 11000100 | na | 20000100 |
| ε(21) = 01000001 | 01001001 | 01100001 | 01010001 | 01000002 | 01000101 | 01000011 | 02000001 | na | 11000001 |
| ε(21) = 00110000 | 00111000 | 00210000 | 00120000 | 00110001 | 00110100 | 00110010 | 01110000 | na | 10110000 |
| ε(21) = 00002000 | | 00102000 | 00012000 | 00002001 | 00002100 | 00002010 | 01002000 | na | 10002000 |
| ε(22) = 10000010 | 10010010 | 10001010 | 10100010 | 10000020 | 10000011 | 10000110 | 20000010 | 11000010 | na |
| ε(22) = 01000100 | 01010100 | 01001100 | 01100100 | 01000100 | 01000101 | 01000200 | 11000200 | 02000100 | na |
| ε(22) = 00101000 | 00111000 | 00102000 | 00201000 | 00101010 | 00101001 | 00101100 | 10101000 | 01101000 | na |
| ε(22) = 00020000 | 00111000 | 00021000 | 00120000 | 00020010 | 00020001 | 00020100 | 10020000 | 01020000 | na |

Consider encoding just 1 with for all writes. Then the number of writes for a q-ary MOH code is given by $$t = n(q-1). \quad (36)$$

This example is thus a 16-write ternary MOH code. The with $c_i$ to program for all writes is shown in Table 18.

TABLE 18

Encoding map for a ternary MOH code for n = 8.

| From $\vec{y}$/To $\vec{m}$ | 00 | 01 | 02 | 10 | 11 | 12 | 20 | 21 | 22 |
|---|---|---|---|---|---|---|---|---|---|
| 00 | na | $c_1$ | $c_2$ | $c_3$ | $c_4$ | $c_5$ | $c_6$ | $c_7$ | $c_8$ |
| 01 | $c_2$ | na | $c_1$ | $c_5$ | $c_3$ | $c_4$ | $c_8$ | $c_6$ | $c_7$ |
| 02 | $c_1$ | $c_2$ | na | $c_4$ | $c_5$ | $c_3$ | $c_7$ | $c_8$ | $c_6$ |
| 10 | $c_6$ | $c_7$ | $c_8$ | na | $c_1$ | $c_2$ | $c_3$ | $c_4$ | $c_5$ |
| 11 | $c_8$ | $c_6$ | $c_7$ | $c_2$ | na | $c_1$ | $c_5$ | $c_3$ | $c_4$ |

TABLE 18-continued

Encoding map for a ternary MOH code for n = 8.

| From $\vec{y}$/To $\vec{m}$ | 00 | 01 | 02 | 10 | 11 | 12 | 20 | 21 | 22 |
|---|---|---|---|---|---|---|---|---|---|
| 12 | $c_7$ | $c_8$ | $c_6$ | $c_1$ | $c_2$ | na | $c_4$ | $c_5$ | $c_3$ |
| 20 | $c_3$ | $c_4$ | $c_5$ | $c_6$ | $c_7$ | $c_8$ | na | $c_1$ | $c_2$ |
| 21 | $c_5$ | $c_3$ | $c_4$ | $c_8$ | $c_6$ | $c_7$ | $c_2$ | na | $c_1$ |
| 22 | $c_4$ | $c_5$ | $c_3$ | $c_7$ | $c_8$ | $c_6$ | $c_1$ | $c_2$ | na |

Verifying (10) finds the i-th with to program over GF(3) by using entries from Table 18. For instance, to store a new message $\vec{m}=(1,2)$ when the message $\vec{y}=(2,2)$ is decoded from the current $\vec{c}$. Then the sixth with is used to program to a higher state. Using (10), solve for $h_k$, k=1,2 by $$h_k = m_k - y_k, \text{ for } k = 1, 2 \quad (37)$$

$$\rightarrow h_1 = 1 - 2,$$
$$= 2,$$
$$\rightarrow h_2 = 2 - 2,$$
$$= 0,$$

thus $\vec{h} = (2,0)$ and converts to i=6.

Sum-Rate Analysis for q-Ary Modified One-Hot Codes

Start by analyzing the sum-rate of the above ternary MOH code example. From Tables 15-17 of Example 4, the first two writes guarantee $|M_1|=n+1$ messages. The third write decreases in data alphabet size by 1. The simulation shows the data alphabet size for the fourth write is the same. Relate this sequence to that of a binary MOH code. In other words, the size of the message set decreases after every (q−1) writes. Physically, this means in the worst case, a floating gate cell has reached the highest state allowable and can no longer be programmed. For Example 4, then $$|M_1| = 9,$$
$$|M_2| = 9,$$
$$|M_3| = 8,$$
$$|M_4| = 8,$$
$$|M_5| = 7,$$
$$|M_6| = 7,$$
$$\ldots,$$
$$|M_{15}| = 2,$$
$$|M_{16}| = 2.$$

Figure 6:
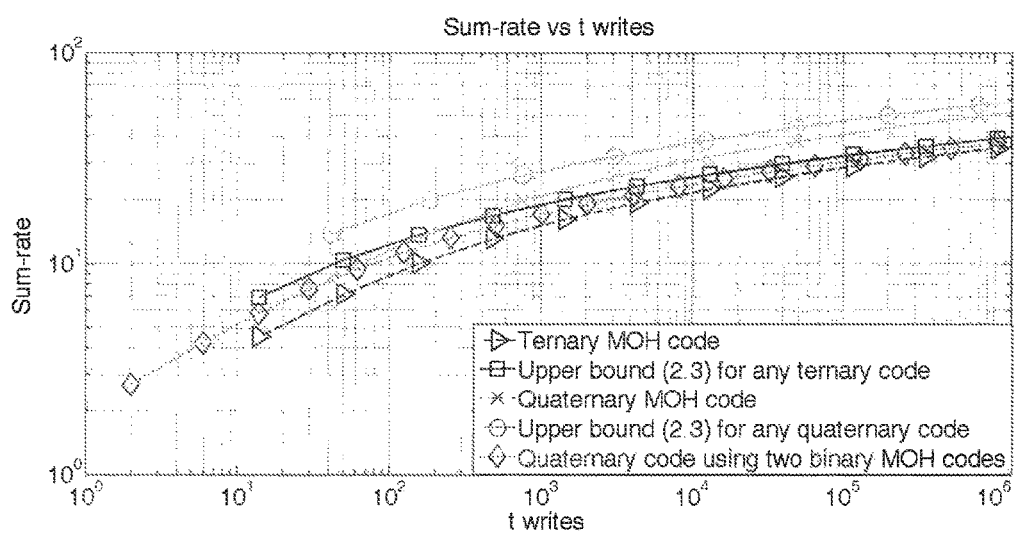
FIG. 6 is a plot of sum-rates for q-ary MOH codes and upper-bounds for WAM codes.

FIG. 6 shows the sum-rates of a ternary and a quaternary MOH code along with the corresponding ternary and quaternary capacities for any WAM code. The upper solid curves represent the sum-rates achieved for a quaternary MOH code and the quaternary capacity. The middle solid curve represents the capacity for a ternary code. The two dashed curves represent the sum-rates for a ternary code and the sum-rates for a stacking of two binary MOH codes.

It was shown above that a binary MOH code as described herein outperforms previous binary WOM codes. A further embodiment includes stacking of binary MOH code to construct a quaternary WAM code. Quaternary MOH code embodiments outperform the quaternary stacked construction in terms of the achieved sum-rate for the same number of writes. The gap between the two quaternary sum-rates increase as t increases. This widening gap is a result of a slower rate loss caused by the combination of the smaller sizes of n for the same t and the fact that $|M_j|$ decreases in size by 1 for every (q−1) writes. $F_3$ denotes the ternary gap to capacity constant as t goes to infinity, as follows:

$$F_3 = C - R_{MOH} \quad (38)$$

$$= \lim_{t \to \infty} \left[ \log_2 \binom{t+2}{t} - \sum_{j=1}^{t} \frac{\log_2 |M_j|}{n} \right].$$

Likewise, $F_4$ denotes the quaternary gap to capacity constant as t goes to infinity, as follows:

$$F_4 = C - R_{MOH} \quad (39)$$

$$= \lim_{t \to \infty} \left[ \log_2 \binom{t+3}{t} - \sum_{j=1}^{t} \frac{\log_2 |M_j|}{n} \right].$$

Figure 7:
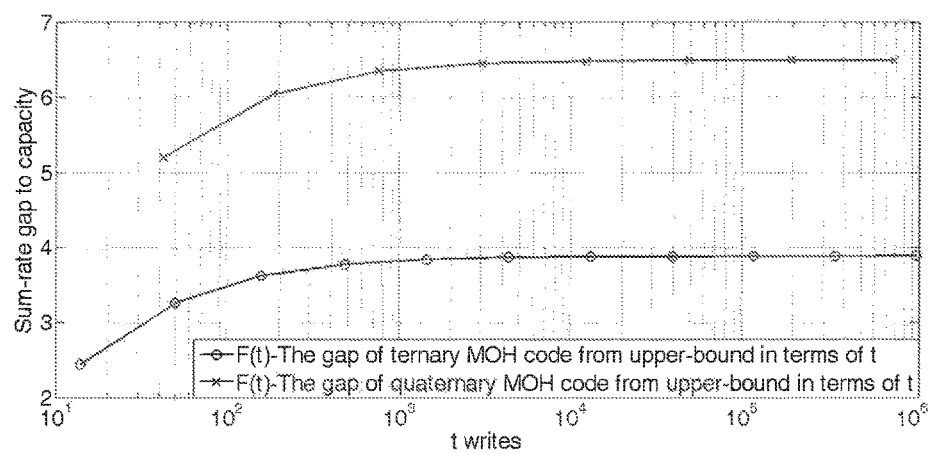
FIG. 7 is a plot showing differences between the upper bound and achieved ternary and quaternary sum-rates for various t.

In FIG. 7, differences between the upper bound and the achieved sum-rates for the ternary and quaternary MOH codes for t values up to 531,439 and 1,048,574 are shown. The numerical results from FIG. 7 show that $F_3$=3.89 and $F_4$=6.49 for a t value of approximately 1000 writes. Thus, the ternary and quaternary MOH codes are both also near-capacity-achieving codes.

All cited publications are incorporated herein by reference in their entirety.

EQUIVALENTS

While the invention has been described with respect to illustrative embodiments thereof, it will be understood that various changes may be made to the embodiments without departing from the scope of the invention. Accordingly, the described embodiments are to be considered merely exemplary and the invention is not to be limited thereby.

The invention claimed is:

1. A method for increasing a sum-rate of a digital memory, comprising:
    encoding one memory cell for each write operation until a last write operation is reached;
    encoding one or two memory cell for the last write operation; and
    wherein encoding comprises re-using a written memory cell by raising the written memory cell to a next state;
    wherein, for a selected code, a sum-rate of the digital memory is increased and is equal to or less than 1.44 bits away from a capacity of the digital memory for the selected code.

2. The method of claim 1, comprising constructing cell state vectors that are uniquely decodable.

3. The method of claim 2, further comprising decoding each permutation of memory cells into a unique value.

4. The method of claim 1, comprising encoding cells synchronously, wherein a cell state vector is related to a selected generation.

5. The method of claim 1, wherein the digital memory comprises write-once memory (WOM).

6. The method of claim 1, wherein the digital memory comprises write-asymmetric memory (WAM).

7. The method of claim 1, wherein the selected code is a ternary code and the sum-rate is equal to or less than 3.89 bits away from the capacity of the digital memory.

8. The method of claim 1, wherein the selected code is a quaternary code and the sum-rate is equal to or less than 6.49 bits away from the capacity of the digital memory.

9. The method of claim 1, comprising using the same expressions for encoding and decoding operations.

10. The method of claim 1, comprising using the same decoding function for all write operations.

11. The method of claim 1, wherein complexities of encoding and decoding functions scale substantially linearly with memory size.

12. Programmed media for use with a processor, comprising:

a code stored on non-transitory storage media compatible with the processor, the code containing instructions to direct the processor to increase a sum-rate of a digital memory by:

encoding one memory cell for each write operation until a last write operation is reached;

encoding one or two memory cell for the last write operation; and wherein encoding comprises re-using a written memory cell by raising the written memory cell to a next state;

wherein, for a selected code, a sum-rate of the digital memory is increased and is equal to or less than 1.44 bits away from a capacity of the digital memory for the selected code.

13. The programmed media of claim 12, comprising constructing cell state vectors that are uniquely decodable.

14. The programmed media of claim 13, further comprising decoding each permutation of memory cells into a unique value.

15. The programmed media of claim 12, comprising encoding cells synchronously, wherein a cell state vector is related to a selected generation.

16. The programmed media of claim 12, wherein the digital memory comprises write-once memory (WOM).

17. The programmed media of claim 12, wherein the digital memory comprises write-asymmetric memory (WAM).

18. A digital memory device comprising the programmed media of claim 12 and digital memory.

19. The digital memory device of claim 18, wherein the digital memory comprises write-once memory (WOM).

20. The digital memory device of claim 18, wherein the digital memory comprises write-asymmetric memory (WAM).

* * * * *